United States Patent

[11] 3,569,745

[72] Inventor John J. Kardash
Acton, Mass.
[21] Appl. No. 773,916
[22] Filed Nov. 6, 1968
[45] Patented Mar. 9, 1971
[73] Assignee Sylvania Electric Products Incorporated

[54] TRANSISTOR LOGIC CIRCUIT
12 Claims, 1 Drawing Fig.

[52] U.S. Cl. .......... 307/291, 307/247
[51] Int. Cl. .......... H03k 3/286
[50] Field of Search .......... 307/291, 247

[56] References Cited

UNITED STATES PATENTS

| | | | |
|---|---|---|---|
| 3,351,778 | 11/1967 | Seelbach et al. | 307/291 |
| 3,436,563 | 4/1969 | Regitz | 307/228X |
| 3,444,395 | 5/1969 | Foster et al. | 307/291 |
| 3,473,045 | 10/1969 | Niemann | 307/291X |

*Primary Examiner*—Donald D. Forrer
*Assistant Examiner*—John Zazworsky
*Attorneys*—David M. Keay, Norman J. O'Malley and Elmer J. Nealon

ABSTRACT: Bistable transistor-transistor logic circuit in which the turn-on and turnoff times of a saturated output transistor are decreased by the operation of a bypass circuit which diverts a portion of the output transistor driving current away from the transistor after it has been driven into saturation. The bistable logic circuit is triggered from one state to the other by a clock pulse applied to a control circuit having an input transistor connected directly to the clock pulse terminal and to a capacitance. During the clock pulse the input transistor conducts and charges the capacitance. Upon termination of the clock pulse the stored charge is employed to initiate switching.

PATENTED MAR 9 1971 3,569,745
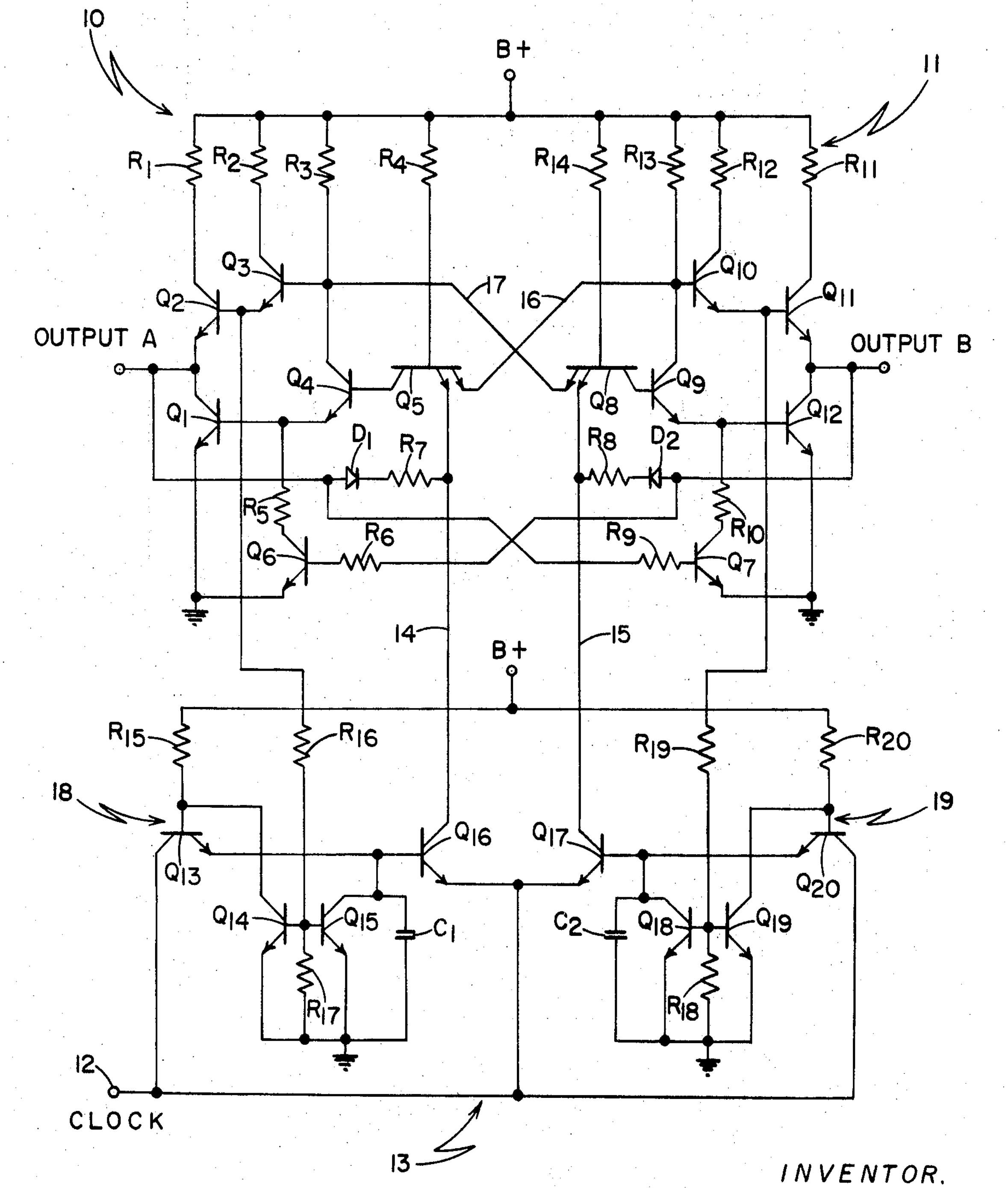
INVENTOR.
JOHN J. KARDASH
BY David M. Keay
AGENT.

TRANSISTOR LOGIC CIRCUIT

BACKGROUND OF THE INVENTION

This invention relates to logic circuits. More particularly, it is concerned with high speed digital logic circuits employing transistors.

Various types of digital logic circuits which are particularly amenable to fabrication as monolithic integrated circuit networks have been developed. Of these, the so-called transistor-transistor logic type (TTL) has become widely accepted because of the availability of certain circuits having favorable switching speeds, power dissipation, immunity to noise, fanout (the number of succeeding logic circuits which can be operated with parallel input connections to the output connection of a given logic circuit) and capacitive load driving capability. However, during one of the two operating states of a transistor-transistor logic circuit, the output transistor operates in saturation. Thus, there is a delay in the switching speed of the circuit because of the time required to sweep out the charge carriers stored in the saturated output transistor. In addition, there is also delay in driving the output transistor into saturation because all the available driving current does not flow into the output transistor.

SUMMARY OF THE INVENTION

Improved switching speeds are obtained with logic circuits in accordance with the present invention. A logic circuit of the invention includes an output circuit means which has an input connection connected to a driving circuit means. The output circuit means operates in a high conduction condition in response to receiving a predetermined amount of driving current from the driving circuit means, and operates in a low conduction condition in response to receiving less than the predetermined amount of driving current from the driving circuit means. The driving circuit means is capable when in a high conduction condition to supply in excess of the predetermined amount of driving current to the output circuit means to cause the output circuit means to operate in the high conduction condition. When the driving circuit means is in a low conduction condition, it supplies less than the predetermined amount of driving current.

The logic circuit also includes a bypass circuit means connected to the input connection of the output circuit means. The bypass circuit means operates when in a first condition to divert a portion of the current in excess of the predetermined amount of driving current flowing from the driving circuit means away from the output circuit means, and operates when in a second condition to permit current flowing from the driving circuit means in excess of the predetermined amount of driving current to flow into the output circuit means. A bypass circuit control means connected to the bypass circuit means causes the bypass circuit means to operate in the first condition when the driving circuit means and the output circuit means are both in high conduction conditions.

Thus, the circuit operates to provide excess driving current to the output circuit means causing it to switch rapidly from the low conduction condition to the high conduction condition; and after the high conduction condition has been attained, the amount of driving current flowing into the output circuit means is reduced permitting it to be switched rapidly from the high conduction condition to the low conduction condition.

Faster switching speeds are also provided by a control circuit which operates to change the operating state of the logic circuit. The control circuit includes an output connection from the control circuit for transmitting a signal to change the state of the logic circuit and an input connection to the control circuit for transmitting a signal to the control circuit indicative of the state of the logic circuit. The control circuit also includes a signal input means having a signal input transistor with its emitter connected to a charge storage device, its collector connected to a signal input connection, and its base connected to a first source of reference potential. The signal input means is operable when in a high conduction condition to cause a charge to be stored in the charge storage device.

A control means is connected to the input connection to the control circuit and to the base of the signal input transistor. The control means operates in a first condition in response to a first signal condition at the input connection to the control circuit and in a second condition in response to a second signal condition at the input connection. The signal input means operates in a low conduction condition in the absence of an input signal at the signal input connection or when the control means is in the second condition. The signal input means operates in the high conduction condition to charge the charge storage device during the presence of an input signal at the signal input connection while the control means is in the first condition.

A switching means connects the charge storage device to the output connection from the control circuit and operates to prevent the occurrence of a signal at the output connection during the presence of an input signal at the signal input connection. The switching means employs the charge stored in the charge storage device to produce a signal at the output connection from the control circuit for changing the state of the logic circuit in response to termination of the input signal at the signal input connection.

Since the signal input connection is connected to the charge storage device through a single signal input transistor, the circuit for charging the charge storage device responds very quickly to changes in voltage at the signal input connection. Thus, the charge storage device is charged rapidly after the leading edge of an input pulse, permitting faster switching speeds.

BRIEF DESCRIPTION OF THE DRAWING

Various objects, features, and advantages of the logic circuit of the invention together with its mode of operation will be apparent from the following detailed discussion and the accompanying drawing wherein the single FIG. is a schematic circuit diagram of a bistable logic circuit in accordance with the invention.

DETAILED DESCRIPTION OF THE INVENTION

The bistable circuit according to the invention as illustrated in the FIG. includes two cross-coupled flip-flop sections 10 and 11. The circuit has a first operating state during which the output transistor $Q_1$ of the first flip-flop section is in a heavily conducting condition producing a low level voltage signal at the output terminal A, and the output transistor $Q_{12}$ of the second flip-flop section 11 is in a low conducting condition producing a high level voltage signal at the output terminal B. In this operating state, the first flip-flop section 10 may be considered ON and the second flip-flop section 11 may be considered OFF.

A clock pulse of approximately the same voltage as the high level voltage signal is periodically applied to a clock signal input terminal 12. A control circuit 13 employs each clock pulse to reverse the operating conditions of the two flip-flop sections, switching the section which is OFF to ON and switching the section which is ON to OFF.

Flip-Flop Sections—Description

The first flip-flop section 10 includes a first dual-emitter NPN flip-flop transistor $Q_5$ having its base connected through a resistance $R_4$ to a source of positive voltage labeled B+. One of the two emitters is connected to a feedback connection 16 from the second flip-flop section 11. The other emitter is connected to a first output connection line 14 from the control circuit 13. The collector of the first flip-flop transistor $Q_5$ is connected directly to the base of a first NPN driving transistor $Q_4$.

The collector of the driving transistor $Q_4$ is connected through a resistance $R_3$ to the B+ voltage source, and its emitter is connected directly to the base of the first NPN output transistor $Q_1$. The emitter of the driving transistor $Q_4$ is also connected through a resistance $R_5$ to the collector of a first NPN bypass transistor $Q_6$. The emitters of the first output transistor $Q_1$ and the first bypass transistor $Q_6$ are connected to ground. The collector of the first output transistor $Q_1$ is connected directly to the output terminal A.

Two NPN pullup transistors $Q_3$ and $Q_2$ have their collectors connected to the B+ voltage source through resistances $R_2$ and $R_1$, respectively. The base of transistor $Q_3$ is connected directly to the collector of the driving transistor $Q_4$ and its emitter is connected directly to the base of transistor $Q_2$. The emitter of transistor $Q_3$ is also connected to ground through series resistances $R_{16}$ and $R_{17}$, providing an input connection from the first flip-flop section 10 to the control circuit 13. The emitter of transistor $Q_2$ is connected directly to the output terminal A. Output terminal A is connected to the output connection line 14 from the control circuit 13 by a diode $D_1$ and a resistance $R_7$.

The second flip-flop section 11 is similar to the first flip-flop section 10 including a second dual-emitter NPN flip-flop transistor $Q_8$ having its base connected through a resistance $R_{14}$ to the B+ voltage source. One emitter of transistor $Q_8$ is connected to a feedback connection 17 from the first flip-flop section 10. The other emitter is connected to a second output connection line 15 from the control circuit 13.

The collector of the second flip-flop transistor $Q_8$ is connected directly to the base of a second NPN driving transistor $Q_9$ having its collector connected through a resistance $R_{13}$ to the B+ voltage source. The emitter of the driving transistor $Q_9$ is connected directly to the base of the second NPN output transistor $Q_{12}$ and through a resistance $R_{10}$ to the collector of a second NPN bypass transistor $Q_7$. The emitters of the bypass transistor $Q_7$ and the second output transistor $Q_{12}$ are both connected to ground. The collector of the second output transistor $Q_{12}$ is connected directly to the output terminal B.

Two NPN pullup transistors $Q_{10}$ and $Q_{11}$ have their collectors connected to the B+ voltage source through resistances $R_{12}$ and $R_{11}$, respectively. The base of transistor $Q_{10}$ is connected directly to the collector of the driving transistor $Q_9$ and its emitter is connected directly to the base of transistor $Q_{11}$. The emitter of transistor $Q_{10}$ is also connected to ground through series resistances $R_{19}$ and $R_{18}$, providing an input connection from the second flip-flop section 11 to the control circuit 13. The emitter of pullup transistor $Q_{11}$ is connected directly to the output terminal B. Output terminal B is connected to the output connection line 15 from the control circuit 13 by a diode $D_2$ and a resistance $R_8$.

The collector of the first driving transistor $Q_4$ is connected directly to the first emitter of the second flip-flop transistor $Q_8$ to provide the feedback connection 17 from the first flip-flop section 10 to the second flip-flop section 11, and the collector of the second driving transistor $Q_9$ is connected directly to the first emitter of the first flip-flop transistor $Q_5$ to provide the feedback connection 16 from the second flip-flop section 11 to the first flip-flop section 10.

Output terminal A is connected through a resistance $R_9$ to the base of the second bypass transistor $Q_7$, and output terminal B is connected through a resistance $R_6$ to the base of the first bypass transistor $Q_6$.

Flip-Flop Sections—Operation

The flip-flop circuit operates in the following manner, assuming the first flip-flop section 10 to be ON with the voltage at the output terminal A at the low level and the second flip-flop section 11 to be OFF with the voltage at the output terminal B at the high level. Under these conditions, as will be explained below, the feedback connection 16 from the second flip-flop section 11 presents a relatively high voltage to the first emitter of the first flip-flop transistor $Q_5$. Feedback connection 17 from the first flip-flop section 10 presents a relatively low voltage to the first emitter of the second flip-flop transistor $Q_8$. The output connection lines 14 and 15 from the control circuit 13 are connected to elements in the control circuit which provide high impedances at the second emitters of the flip-flop transistors $Q_5$ and $Q_8$.

With these conditions present at the emitters of the first flip-flop transistor $Q_5$ there is no heavy current flow across the base-emitter junctions of the transistor and the voltage at the base of the transistor is relatively high. Thus, current flows in the collector circuit of the first flip-flop transistor $Q_5$ and into the base of the driving transistor $Q_4$. Transistor $Q_4$ is thus biased into a high conduction condition providing driving current to the base of the first output transistor $Q_1$.

Under steady state conditions the first bypass transistor $Q_6$ is biased to a high conduction condition by the high voltage level present at the output terminal B. Thus, the bypass transistor $Q_6$ and resistance $R_5$ present a low impedance path between the emitter of transistor $Q_4$ and ground. Sufficient current flows from the driving transistor $Q_4$ across the base-emitter junction of the output transistor $Q_1$ to hold that transistor in saturation while under load, and the remaining current from transistor $Q_4$ flows to ground through the bypass transistor $Q_6$ and the resistance $R_5$. With the output transistor $Q_1$ in the saturated condition, the voltage level at the output terminal A is near ground potential. Since the driving transistor $Q_4$ is in a high conduction condition, the voltage at its collector is relatively low, biasing the pullup transistors $Q_3$ and $Q_2$ to substantially nonconducting conditions.

With the first emitter of the second flip-flop transistor $Q_8$ held at a low voltage level by the feedback connection 17 to the collector of the first driving transistor $Q_4$, current flows through resistance $R_{14}$ and across the forward-biased base-emitter junction of the second flip-flop transistor $Q_8$. A large voltage drop occurs across the resistance $R_{14}$ establishing a low voltage at the base of transistor $Q_8$. Under these conditions, although transistor $Q_8$ is operating in saturation, conduction in its collector circuit is slight and the voltage at the collector is low.

This low voltage is applied to the base of the second driving transistor $Q_9$ causing it to operate in a low conduction condition producing a relatively high voltage level at its collector. This voltage is applied by the feedback connection 16 to the first emitter of the first flip-flop transistor $Q_5$, and together with the high impedance provided at the second emitter by the output connection line 14 holds the first flip-flop transistor $Q_5$ in condition to cause current to flow in its collector circuit. Since there is substantially no conduction in the second driving transistor $Q_9$, the second output transistor $Q_{12}$ is in a substantially nonconducting condition providing a high impedance between the output terminal B and ground. The second bypass transistor $Q_7$ is biased to a substantially nonconducting condition by the connection to the output terminal A which is at a low voltage level.

The relatively high voltage present at the collector of transistor $Q_9$ is applied to the base of transistor $Q_{10}$. Since the sum of the resistances $R_{19}$ and $R_{18}$ between the emitter of transistor $Q_{10}$ and ground is large compared to the resistance $R_{13}$, a small current flows through transistor $Q_{10}$ and resistances $R_{19}$ and $R_{18}$. Current flows through transistor $Q_{11}$ and resistance $R_6$ into the base of the first bypass transistor $Q_6$ driving that transistor to the high conduction condition. The voltage drops across the resistance $R_{13}$ and the base-emitter junctions of transistors $Q_{10}$ and $Q_{11}$ establish the high voltage level at the output terminal B.

Control Circuit—Description

The control or steering circuit 13 which changes the operating state of the flip-flop circuit has two sections 18 and 19. The first section 18 includes a first NPN input transistor $Q_{13}$ having its collector connected directly to the clock signal input terminal 12. The base of the input transistor $Q_{13}$ is connected through a resistance $R_{15}$ to the B+ voltage source, and its emitter is connected to the first terminal of a charge storage capacitance $C_1$. The other terminal of the capacitance $C_1$ is connected directly to ground.

A first NPN control transistor $Q_{14}$ has its collector connected directly to the base of the input transistor $Q_{13}$ and its emitter connected directly to ground. Its base is connected between resistances $R_{16}$ and $R_{17}$ in the input connection from the emitter of the pullup transistor $Q_3$ of the first flip-flop section 10.

The first terminal of the capacitance $C_1$ and the emitter of the input transistor $Q_{13}$ are connected directly to the base of a first NPN switching transistor $Q_{16}$. The collector of the switching transistor $Q_{16}$ is connected to the output connection line 14 to the second emitter of the first flip-flop transistor $Q_5$, and its emitter is connected directly to the clock signal input terminal 12. An NPN discharge transistor $Q_{15}$ is connected in shunt across capacitance $C_1$ with its collector connected to the first terminal of the capacitance $C_1$ and its emitter connected to the second terminal of the capacitance $C_1$. The base of transistor $Q_{15}$ is connected to the base of the control transistor $Q_{14}$.

The second section 19 of the control circuit 13 includes a similar arrangement of circuit elements. A second NPN input transistor $Q_{20}$ has its collector connected directly to the clock signal input terminal 12, its base connected through a resistance $R_{20}$ to the B+ voltage source, and its emitter connected directly to the first terminal of a second charge storage capacitance $C_2$. The second terminal of the capacitance $C_2$ is connected directly to ground. The collector of a second NPN control transistor $Q_{19}$ is connected directly to the base of the input transistor $Q_{20}$, its emitter is connected directly to ground, and its base is connected between resistances $R_{19}$ and $R_{18}$ in the input connection from the emitter of the pullup transistor $Q_{10}$ of the second flip-flop section 11. A second switching transistor $Q_{17}$ has its base connected directly to the first terminal of the second capacitance $C_2$, its collector connected directly to the output connection line 15 to the second emitter of the second flip-flop transistor $Q_8$, and its emitter connected directly to the clock signal input terminal 12. A second NPN discharge transistor $Q_{18}$ has its collector connected to the first terminal of the capacitance $C_2$, its emitter connected to the second terminal of the capacitance $C_2$, and its base connected directly to the base of the control transistor $Q_{19}$.

Switching Operation

The control circuit 13 operates to change the operating state of the flip-flop circuit in the following manner, again assuming that the first flip-flop section 10 is ON and the second flip-flop section 11 is OFF. Under these operating conditions the voltage level at the emitter of the pullup transistor $Q_3$ is relatively low and little current flows through resistances $R_{16}$ and $R_{17}$ of the input connection to the first section 18 of the control circuit 13. Thus, a relatively low voltage is present at the bases of transistors $Q_{14}$ and $Q_{15}$ biasing both transistors in substantially nonconducting conditions. The control transistor $Q_{14}$ thus provides a high impedance between the base of the input transistor $Q_{13}$ and ground permitting a relatively high voltage to be established at the base.

The voltage level at the emitter of the pullup transistor $Q_{10}$ of the second flip-flop section 11 is relatively high and some current flows through the transistor and through resistances $R_{19}$ and $R_{18}$ of the input connection to the second section 19 of the control circuit 13. The resulting voltage drop across resistance $R_{18}$ is sufficient to bias both transistors $Q_{18}$ and $Q_{19}$ to conduction. The control transistor $Q_{19}$ thus provides a low impedance between the base of the input transistor $Q_{20}$ and ground causing a relatively low voltage to be established at the base.

In the absence of a clock pulse at the clock signal input terminal 12, the voltage at the terminal is relatively low, approaching ground. The high voltage at the base of the first input transistor $Q_{13}$ forward biases the base-collector junction of that transistor causing it to operate in saturation in the inverse mode. Since the voltage at the collector and consequently at the emitter is low, no current flows in the emitter circuit. The low voltage at the base of the second input transistor $Q_{20}$ biases that transistor in a nonconducting condition. Both charge storage capacitances $C_1$ and $C_2$ are in a discharged condition.

When a positive-going clock pulse is applied at the signal input terminal 12, the voltage increases at the collector and consequently at the emitter of the first input transistor $Q_{13}$. Since the transistor $Q_{13}$ is biased to saturation, by virtue of the first control transistor $Q_{14}$ being nonconducting, current flows in the emitter circuit of the first input transistor $Q_{13}$ and into the first capacitance $C_1$. Since the input transistor $Q_{13}$ is already biased for conduction and there are no resistance elements along the path of current flow, the capacitance $C_1$ charges very rapidly on the leading edge of the clock pulse.

Since the second control transistor $Q_{19}$ is in a conducting condition, the second input transistor $Q_{20}$ remains biased in a nonconducting condition regardless of the voltage at its collector. Therefore, the positive-going clock pulse has no effect on the second section 19 of the control circuit 13.

As the capacitance $C_1$ charges, the voltage at the emitter of the input transistor $Q_{13}$ and at the base of the first switching transistor $Q_{16}$ increases. However, the high voltage level of the clock pulse signal is also present at the emitter of the switching transistor $Q_{16}$ and, therefore, transistor $Q_{16}$ remains nonconducting. Thus, the net result of the clock pulse signal is to cause a charge to be stored in the capacitance $C_1$.

Upon termination of the clock pulse, the voltage at the signal input terminal 12 starts to drop causing reduced conduction through the input transistor $Q_{13}$. The voltage at the emitter of the first switching transistor $Q_{16}$, which is directly connected to the input terminal 12, is also reduced. When the voltage at the emitter of the switching transistor $Q_{16}$ drops, the charged capacitance $C_1$ causes a charge to become stored in the forward biased base-emitter junction of the switching transistor $Q_{16}$ thus biasing that transistor to conduction. As the charge in the transistor is utilized, it is constantly restored by the charge in the capacitance $C_1$.

With switching transistor $Q_{16}$ in a conducting condition, a low impedance path is provided between the second emitter of the first flip-flop transistor $Q_5$ and the signal input terminal 12 by way of the output connection line 14. As the base-emitter junction of the first flip-flop transistor $Q_5$ becomes forward biased, current flows across the junction and through resistance $R_4$ lowering the voltage at the base of transistor $Q_5$. Although transistor $Q_5$ is in saturation, the voltage at its collector is lowered biasing the driving transistor $Q_4$ to a nonconducting condition. As current ceases to flow through transistor $Q_4$, the voltage at its collector rises providing a high voltage level at the first emitter of the second flip-flop transistor $Q_8$ by means of the feedback connection 17. The conduction condition of the second flip-flop transistor $Q_8$ is thus changed reversing the operating condition of the second flip-flop section 11 as will be explained below.

As conduction through the driving transistor $Q_4$ decreases, driving current into the base of the output transistor $Q_1$ is reduced. As mentioned previously, the first bypass transistor $Q_6$ is in a conducting condition by virtue of the high voltage level present at output terminal B, and driving current in excess of the amount sufficient to hold the output transistor $Q_1$ in saturation is being diverted away from the output transistor $Q_1$ to ground. Since the amount of charge stored in the base of output transistor $Q_1$ is only sufficient to maintain saturation, when the driving current is reduced the output transistor $Q_1$ switches very rapidly to the nonconducting condition. The output transistor $Q_1$ then provides a high impedance between the output terminal A and ground.

The increased voltage at the base of pullup transistor $Q_3$ together with the low voltage present at the emitter of transistor $Q_2$ biases transistors $Q_3$ and $Q_2$ to increased conduction. These transistors conduct heavily to drive the output load on the output terminal A until the voltage at the output terminal A is restored to the high voltage level established by current flowing through the transistor $Q_2$ into the base of the second bypass transistor $Q_7$.

As explained hereinabove when the first driving transistor $Q_4$ becomes nonconducting, the voltage at its collector rises increasing the voltage at the first emitter of the second flip-flop transistor $Q_8$ by way of the feedback connection 17. With both the base-emitter junctions of the second flip-flop transistor $Q_8$ reverse-biased, current flow through resistance $R_{14}$ decreases. The voltage at the base of transistor $Q_8$ increases thus increasing the voltage at its collector. The second driving transistor $Q_9$ becomes biased to conduction and current flows in its collector and emitter circuits.

The second bypass transistor $Q_7$ is in the nonconducting or high impedance condition by virtue of the connection to the output terminal A which is still at the low voltage level. Therefore, all of the driving current available from the driving transistor $Q_9$ flows into the base of the output transistor $Q_{12}$ quickly driving it into saturation. The saturated output transistor $Q_{12}$ provides a low impedance between the output terminal B and ground thus establishing a low voltage level at the output terminal B.

The increased current flow in the collector circuit of the driving transistor $Q_9$ reduces the voltage at the collector thereby holding the pullup transistors $Q_{10}$ and $Q_{11}$ out of conduction. The feedback connection 16 from the collector of the second driving transistor $Q_9$ to the first emitter of the first flip-flop transistor $Q_5$ causes the first base-emitter junction of the first flip-flop transistor $Q_5$ to become forward biased. This base-emitter junction will remain forward biased after the high impedance condition is restored at the output connection line 14 and the second base-emitter junction of transistor $Q_5$ is no longer forward biased. Thus, the operating state of the flip-flop circuit is changed with the first flip-flop section 10 held OFF and the second flip-flop section 11 held ON.

With the first flip-flop section 10 switched to OFF the high voltage level at the output terminal A biases the second bypass transistor $Q_7$ to conduction. A low impedance path to ground is thus provided to the current flowing from the driving transistor $Q_9$. Current is diverted away from the output transistor $Q_{12}$ now operating in saturation, so that only enough current flows into the base of transistor $Q_{12}$ to maintain that transistor in saturation. Thus, only a small charge remains stored in the base of the output transistor $Q_{12}$, and that transistor is amenable to being turned off very rapidly during the next switching operation.

With the second flip-flop section 11 ON the low voltage level at the output terminal B biases the first bypass transistor $Q_6$ to the nonconducting condition. A high impedance to current flow between the emitter of the first driving transistor $Q_4$ and ground is thus provided so that during the next switching operation all the driving current from the driving transistor $Q_4$ will be employed to turn the first output transistor $Q_1$ on rapidly.

When the first flip-flop section 10 switches OFF and the voltage at the output terminal A rises, current flows through the forward-biased diode $D_1$ and the resistance $R_7$ to supply collector current to the switching transistor $Q_{16}$. As transistor $Q_{16}$ ceases to conduct, any capacitance load on the connection line 14 is quickly charged restoring the base-emitter junction of the first flip-flop transistor $Q_5$ to a reverse biased condition. Pullup transistor $Q_3$ conducts sufficiently to bias the transistors $Q_{14}$ and $Q_{15}$ to conduction. With discharge transistor $Q_{15}$ conducting, any unused charge remaining in the capacitance $C_1$ is dissipated through that transistor. Since the control transistor $Q_{14}$ is conducting, the base of the input transistor $Q_{13}$ becomes biased to a low voltage level and, therefore, the next clock pulse will have no effect on the first section 18 of the control circuit 13.

When the second flip-flop section 11 is ON, and the voltage level at the output terminal B is low, the diode $D_2$ prevents current flow from the output connection line 15 to the output terminal. The voltage level at the emitter of the pullup transistor $Q_{10}$ is such that transistors $Q_{18}$ and $Q_{19}$ are biased to the nonconducting condition. Thus, the discharge transistor $Q_{18}$ provides a high impedance across the capacitance $C_2$ which will not interfere with its becoming charged. Since the control transistor $Q_{19}$ also provides a high impedance, the base of the input transistor $Q_{20}$ is biased at a relatively high voltage level permitting that transistor to become conductive during the next clock pulse.

Thus, the operating state of the circuit is changed with the first flip-flop section 10 OFF and the second flip-flop section 11 ON. The control circuit operating conditions are also reversed, and the circuit is in readiness to be switched back to the original state by the occurrence of the next clock pulse.

Conclusion

The circuit described provides faster turnoff time of the conducting output transistor since driving current in excess of the amount sufficient to maintain the output transistor in saturation is diverted to ground by the bypass transistor circuit. Thus, only a small charge is stored in the base-emitter junction of the conducting output transistor to be discharged when that transistor is turned off. During turn-on the driving transistor circuit provides driving current in excess of the amount sufficient to sustain saturation. Since a very high impedance to ground is provided by the nonconducting bypass transistor, substantially all the driving current flows into the output transistor turning it on rapidly. Therefore, the circuit provides both rapid turnoff and turn-on of the output transistors.

The arrangement in the control circuit of the signal input terminal, input transistor, and charge storage capacitance permits a fast reaction upon the leading edge of the clock pulse. Since the input transistor is already biased for conduction when the leading edge of the clock pulse is applied at the collector, conduction occurs through that transistor very quickly. In addition, since the signal input terminal is connected directly to the collector of the transistor and the capacitance is connected directly to the emitter, there is no resistance in the path of the charging current to cause delay.

Thus, because of the decreased turnoff and turn-on times of the output transistors and the decreased time for the control circuit to react to clock pulses, reliable triggering may be obtained with clock pulses of short duration and high frequency.

The bistable logic circuit as described is particularly amenable to fabrication as a monolithic integrated circuit network in which all similar circuit elements are produced in a body of semiconductor material at the same time in a series of masked diffusion steps. Thus, the corresponding circuit elements in the two sections of the circuit are identical providing similar characteristics when switching the circuit to either state. The circuit employs only transistors, diodes, and resistances which are readily produced by known methods of controlled diffusion of impurities. Capacitances $C_1$ and $C_2$ may each consist of two conductive layers separated by a layer of dielectric material or they may be the capacitances across the junctions of reverse biased diodes.

While there has been shown and described what is considered a preferred embodiment of the present invention, it will be obvious to those skilled in the art that various changes and modifications may be made therein without departing from the invention as defined in the appended claims.

I claim:

1. A bistable circuit including in combination:

a first flip-flop element having a first operating condition and a second operating condition;

a second flip-flop element having a first operating condition and a second operating condition;

feedback connections between the first and second flip-flop elements for causing the flip-flop elements to operate in different operating conditions;

a first driving circuit means including an input connection connected to the first flip-flop element and having a low conduction condition and a high conduction condition, said first driving circuit means being operable in the high conduction condition when the first flip-flop element is in the first operating condition and being operable in the low conduction condition when the first flip-flop element is in the second operating condition;

a first output circuit means having an input connection connected to the first driving circuit means and having a low conduction condition and a high conduction condition, said first output circuit means being operable in the high conduction condition in response to a predetermined amount of driving current and being operable in the low conduction condition in response to less than the predetermined amount of driving current;

said first driving circuit means being operable when in the high conduction condition to supply in excess of the predetermined amount of driving current to the first output circuit means to cause the first output circuit means to operate in the high conduction condition, and being operable when in the low conduction condition to supply less than the predetermined amount of driving current;

first bypass circuit means connected to the input connection of the first output circuit means and operable when in a first condition to divert a portion of the current in excess of the predetermined amount of driving current flowing from the first driving circuit means away from the first output circuit means, and operable when in a second condition to permit current flowing from the first driving circuit means in excess of the predetermined amount of driving current to flow into the first output circuit means;

a second driving circuit means including an input connection connected to the second flip-flop element and having a low conduction condition and a high conduction condition, said second driving circuit means being operable in the high conduction condition when the second flip-flop element is in the first operating condition and being operable in the low conduction condition when the second flip-flop element is in the second operating condition;

a second output circuit means having an input connection connected to the second driving circuit means and having a low conduction condition and a high conduction condition, said second output circuit means being operable in the high conduction condition in response to a predetermined amount of driving current and being operable in the low conduction condition in response to less than the predetermined amount of driving current;

said second driving circuit means being operable when in the high conduction condition to supply in excess of the predetermined amount of driving current to the second output circuit means to cause the second output circuit means to operate in the high conduction condition, and being operable when in the low conduction condition to supply less than the predetermined amount of driving current;

second bypass circuit means connected to the input connection of the second output circuit means and operable when in a first condition to divert a portion of the current in excess of the predetermined amount of driving current flowing from the second driving circuit means away from the second output circuit means, and operable when in a second condition to permit current flowing from the second driving circuit means in excess of the predetermined amount of driving current to flow into the second output circuit means;

first biasing means connected to the first bypass circuit means and coupled to the second flip-flop element, said first biasing means being operable to cause the first bypass circuit means to operate in the first condition when the second flip-flop element is in the second operating condition and to cause the first bypass circuit means to operate in the second condition when the second flip-flop element is in the first operating condition; and second biasing means connected to the second bypass circuit means and coupled to the first flip-flop element, said second biasing means being operable to cause the second bypass circuit means to operate in the first condition when the first flip-flop element is in the second operating condition and to cause the second bypass circuit means to operate in the second condition when the first flip-flop element is in the first operating condition.

2. A bistable circuit in accordance with claim 1 wherein:

said first bypass circuit means includes means providing a low impedance between the input connection of the first output circuit means and a first source of reference potential when the first bypass circuit means is in the first condition and a high impedance between the input connection of the first output circuit means and the first source of reference potential when the first bypass circuit means is in the second condition; and said second bypass circuit means includes means providing a low impedance between the input connection of the second output circuit means and the first source of reference potential when the second bypass circuit means is in the first condition and a high impedance between the input connection of the second output circuit means and the first source of reference potential when the second bypass circuit means is in the second condition.

3. A bistable circuit in accordance with claim 2 wherein:

said first bypass circuit means includes a first bypass transistor connected between the input connection of the first output circuit means and the first source of reference potential, said first bypass transistor being in a high conduction condition when the first bypass circuit means is in the first condition and being in a low conduction condition when the first bypass circuit means is in the second condition;

said second bypass circuit means includes a second bypass transistor connected between the input connection of the second output circuit means and the first source of reference potential, said second bypass transistor being in a high conduction condition when the second bypass circuit means is in the first condition and being in a low conduction condition when the second bypass circuit means is in the second condition;

said first biasing means is connected to the second output circuit means and being operable to bias the first bypass transistor to the high conduction condition when the second output circuit means is in the low conduction condition and being operable to bias the first bypass transistor to the low conduction condition when the second output circuit means is in the high conduction condition; and said second biasing means is connected to the first output circuit means and being operable to bias the second bypass transistor to the high conduction condition when the first output circuit means is in the low conduction condition and being operable to bias the second bypass transistor to the low conduction condition when the first output circuit means is in the high conduction condition.

4. A bistable circuit in accordance with claim 3 wherein:

said first driving circuit means includes a first driving transistor operable in a high conduction condition when the first flip-flop element is in the first operating condition and operable in a low conduction condition when the first flip-flop element is in the second operating condition;

said first output circuit means includes a first output transistor operable in a high conduction condition in response to a predetermined amount of driving current from the first driving circuit means and operable in a low conduction condition in response to less than the predetermined amount of driving current from the first driving circuit means;

said second driving circuit means includes a second driving transistor operable in a high conduction condition when the second flip-flop element is in the first operating condition and operable in a low conduction condition when the second flip-flop element is in the second operating condition; and said second output circuit means includes a second output transistor operable in a high conduction condition in response to a predetermined amount of driving current from the second driving circuit means and operable in a low conduction condition in response to less than the predetermined amount of driving current from the second driving circuit means.

5. A bistable circuit in accordance with claim 4 wherein:

said first driving transistor has its base connected to the input connection of the first driving circuit means and its collector connected to a second source of reference potential;

said first output transistor has its base connected to the emitter of the first driving transistor, its collector connected to the second source of reference potential, and its emitter connected to the first source of reference potential;

said second driving transistor has its base connected to the input connection of the second driving circuit means and its collector connected to the second source of reference potential;

said second output transistor has its base connected to the emitter of the second driving transistor, its collector connected to the second source of reference potential, and its emitter connected to the first source of reference potential;

said first bypass transistor has its collector connected to the emitter of the first driving transistor, its emitter connected to the first source of reference potential, and its base connected to the collector of the second output transistor; and said second bypass transistor has its collector connected to the emitter of the second driving transistor, its emitter connected to the first source of reference potential, and its base connected to the collector of the first output transistor.

6. A control circuit for providing a signal to a circuit means to change the operating state of the circuit means including in combination:

a signal input connection;

an output connection from the control circuit to said circuit means for transmitting a signal to change the state of the circuit means;

an input connection to the control circuit from said circuit means for transmitting a signal indicative of the state of the circuit means;

a charge storage device;

signal input means including a signal input transistor having its emitter connected to the charge storage device, its collector connected to the signal input connection, and its base connected to a first source of reference potential, said signal input means being operable when in a high conduction condition to cause a charge to be stored in the charge storage device;

control means connected to the input connection from said circuit means and to the base of the signal input transistor, said control means being operable in a first condition in response to a first signal condition at the input connection from said circuit means and in a second condition in response to a second signal condition at the input connection from said circuit means;

said signal input means being operable in a low conduction condition in the absence of an input signal at the signal input connection, being operable in the low conduction condition when the control means is in the second condition, and being operable in the high conduction condition during the presence of an input signal at the signal input connection while the control means is in the first condition; and switching means connecting the charge storage device to the output connection to said circuit means and operable to prevent the occurrence of a signal at the output connection during the presence of an input signal at said signal input connection and operable to employ the charge stored in the charge storage device to produce a signal at the output connection to said circuit means for changing the state of the circuit means in response to termination of the input signal at said signal input connection.

7. A control circuit in accordance with claim 6 wherein:

said control means includes a control transistor having its base connected to the input connection from said circuit means and its collector connected to the base of the signal input transistor, said control transistor being operable in a low conduction condition when the first signal condition is present at the input connection from said circuit means and being operable in a high conduction condition when the second signal condition is present at the input connection from said circuit means; and said signal input transistor being biased to the low conduction condition when the control transistor is in the high conduction condition.

8. A control circuit in accordance with claim 7 further including:

discharging means including a discharging transistor, said discharging transistor being connected in shunt across the charge storage device and having its base connected to the input connection from said circuit means, said discharging transistor being biased to a low conduction condition when the first signal condition is present on the input connection from said circuit means and being biased to a high conduction condition when the second signal condition is present on the output connection from the circuit means whereby the charge storage device is discharged.

9. A bistable circuit including in combination:

a first flip-flop section having a first operating condition and a second operating condition;

a second flip-flop section having a first operating condition and a second operating condition;

feedback connections between the first and the second flip-flop sections for causing the flip-flop sections to operate in different operating conditions;

a control circuit having control input connections from the first and second flip-flop sections and output connections to the first and second flip-flop sections;

a first charge storage device in said control circuit;

a signal input terminal connected to the control circuit;

first signal input means in said control circuit including a first signal input transistor having its emitter connected to the first charge storage device, its collector connected to the signal input terminal, and its base connected to a first source of reference potential, said first signal input means being operable when in a high conduction condition to cause a charge to be stored in the first charge storage device;

first control means in said control circuit connected to a control input connection and to the base of the first signal input transistor, said first control means being operable in a first condition when the first flip-flop section is in the first operating condition and the second flip-flop section is in the second operating condition and being operable in a second condition when the first flip-flop section is in the second operating condition and the second flip-flop section is in the first operating condition;

said first signal input means being operable in a low conduction condition in the absence of an input signal at the signal input terminal, being operable in the low conduction condition when the first control means is in the second condition, and being operable in the high conduction condition during the presence of an input signal at the signal input terminal while the first control means is in the first condition;

first switching means in said control circuit connecting the first charge storage device to an output connection and operable to prevent the occurrence of a signal at the output connection during the presence of an input signal at said signal input terminal and operable in response to termination of the input signal at said signal input terminal to employ the charge stored in the first charge storage device to trigger the first flip-flop section to the second operating condition and the second flip-flop section to the first operating condition;

a second charge storage device in said control circuit;

second signal input means in said control circuit including a second signal input transistor having its emitter connected to the second charge storage device, its collector connected to the signal input terminal, and its base connected to the first source of reference potential, said second signal input means being operable when in a high conduction condition to cause a charge to be stored in the second charge storage device;

second control means in said control circuit connected to a control input connection and to the base of the second signal input transistor, said second control means being operable in a first condition when the first flip-flop section is in the second operating condition and the second flip-flop section is in the first operating condition and being operable in a second condition when the first flip-flop section is in the first operating condition and the second flip-flop section is in the second operating condition;

said second signal input means being operable in a low conduction condition in the absence of an input signal at the signal input terminal, being operable in the low conduction condition when the second control means is in the second condition, and being operable in the high conduction condition during the presence of an input signal at the signal input terminal while the second control means is in the first condition; and second switching means in said control circuit connecting the second charge storage device to an output connection and operable to prevent the occurrence of a signal at the output connection during the presence of an input signal at said signal input terminal and operable in response to termination of the input signal at said signal input terminal to employ the charge stored in the second charge storage device to trigger the second flip-flop section to the second operating condition and the first flip-flop section to the first operating condition.

10. A bistable circuit in accordance with claim 9 wherein:

said first control means includes a first control transistor having its base connected to a control input connection and its collector connected to the base of the first signal input transistor, said first control transistor being operable in a low conduction condition when the first flip-flop section is in the first operating condition and the second flip-flop section is in the second operating condition and being operable in a high conduction condition when the first flip-flop section is in the second operating condition and the second flip-flop section is in the first operating condition;

said first signal input transistor being biased to the low conduction condition when the first control transistor is in the high conduction condition;

said second control means includes a second control transistor having its base connected to a control input connection and its collector connected to the base of the second signal input transistor, said second control transistor being operable in a low conduction condition when the first flip-flop section is in the second operating condition and the second flip-flop section is in the first operating condition and being operable in a high conduction condition when the first flip-flop section is in the first operating condition and the second flip-flop section is in the second operating condition; and said second signal input transistor being biased to the low conduction condition when the second control transistor is in the high conduction condition.

11. A bistable circuit in accordance with claim 10 wherein:

said first switching means includes a first switching transistor having its base connected to the first charge storage device, its emitter connected to the signal input terminal, and its collector connected to the first flip-flop section, said first switching transistor being operable to switch the first flip-flop section from the first operating condition to the second operating condition in response to a charge in the first charge storage device and to termination of the input signal at said signal input terminal; and said second switching means includes a second switching transistor having its base connected to the second charge storage device, its emitter connected to the signal input terminal, and its collector connected to the second flip-flop section, said second switching transistor being operable to switch the second flip-flop section from the first operating condition to the second operating condition in response to a charge in the second charge storage device and to termination of the input signal at the signal input terminal.

12. A bistable circuit in accordance with claim 10 further including:

first discharging means including a first discharging transistor, said first discharging transistor being connected in shunt across the first charge storage device and having its base connected to a control input connection, said first discharging transistor being biased to a low conduction condition when the first flip-flop section is in the first operating condition and the second flip-flop section is in the second operating condition and being biased to a high conduction condition when the first flip-flop section is in the second operating condition and the second flip-flop section is in the first operating condition whereby the first charge storage device is discharged;

second discharging means including a second discharging transistor, said second discharging transistor being connected in shunt across the second charge storage device and having its base connected to a control input connection, said second discharging transistor being biased to a low conduction condition when the first flip-flop section is in the second operating condition and the second flip-flop section is in the first operating condition and being biased to a high conduction condition when the first flip-flop section is in the first operating condition and the second flip-flop section is in the second operating condition whereby the second charge storage device is discharged.